US006801433B2

(12) United States Patent
Lindholm et al.

(10) Patent No.: US 6,801,433 B2
(45) Date of Patent: Oct. 5, 2004

(54) METHOD AND APPARATUS FOR COOLING ELECTRICAL FUSES

(75) Inventors: Brian Eric Lindholm, Blacksburg, VA (US); Paul Stephen Pate, Troutville, VA (US); Allen Michael Ritter, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/683,496

(22) Filed: Jan. 9, 2002

(65) Prior Publication Data

US 2003/0085048 A1 May 8, 2003

Related U.S. Application Data

(60) Provisional application No. 60/284,819, filed on Apr. 19, 2001.

(51) Int. Cl.[7] .................................................. H05K 7/20

(52) U.S. Cl. ........................ 361/707; 361/702; 361/696; 361/712; 165/80.2; 165/170; 165/907; 337/166; 337/248

(58) Field of Search ................................ 361/696–699, 361/702–710, 712; 337/203, 248, 166, 168, 154, 231, 257; 165/80.2, 80.3, 80.4, 165, 185, 170, 907, 80.5; 257/713, 721–726; 174/15.1, 16.3, 41.3; 62/3.2, 3.7, 259.2; 137/614.01, 614.02, 614.03, 614.04, 614.05

(56) References Cited

U.S. PATENT DOCUMENTS 3,453,579 A * 7/1969 Cinquin ...................... 337/203
3,671,911 A * 6/1972 Kozacka ..................... 337/166
3,678,431 A * 7/1972 Franklin ..................... 337/185
3,693,128 A * 9/1972 Jacobs, Jr. .................. 337/166
3,713,065 A * 1/1973 Brichant ..................... 337/166
3,715,698 A * 2/1973 Blewitt ....................... 337/166
3,793,603 A * 2/1974 Fontaine ..................... 337/166
4,041,434 A 8/1977 Jacobs, Jr. et al.
4,170,000 A 10/1979 Trayer
4,189,695 A 2/1980 Hirahara
4,375,630 A * 3/1983 Gaia .......................... 337/248
4,475,152 A 10/1984 Ikegame et al.
5,144,531 A * 9/1992 Go et al. .................... 361/702
5,205,353 A 4/1993 Willemsen et al.
5,841,634 A 11/1998 Visser
5,918,469 A 7/1999 Cardella
5,978,220 A 11/1999 Frey et al.
5,987,893 A 11/1999 Schulz-Harder et al.
6,014,312 A 1/2000 Schulz-Harder et al.
6,018,459 A 1/2000 Carlson et al.
6,131,644 A 10/2000 Kohara et al.
6,131,650 A 10/2000 North et al.
6,137,169 A 10/2000 Pace

FOREIGN PATENT DOCUMENTS

DE 1948030 A * 4/1970 .......... H01H/85/14
DE 2029083 12/1970
FR 91187 8/1968
FR 1221387 2/1971
FR 2183852 12/1973
FR 2420202 10/1979

* cited by examiner

*Primary Examiner*—Michael Datskovskiy
(74) *Attorney, Agent, or Firm*—Hunton & Williams LLP

(57) ABSTRACT

An apparatus for cooling electrical protective devices comprises an electrical protective device mounted to at least one electrical terminal, wherein the electrical terminals are cooled to indirectly cool the electrical protective devices. A pressurized coolant source passes a coolant fluid through coolant passages attached to the electrical terminals, thereby cooling the electrical terminals. The cooled electrical terminals maintain the temperature of the electrical protection device within an appropriate operating temperature range. This cooling method may be used to increase the fuse power rating of a fuse array while maintaining electrical coordination between the fuses in the fuse array and electrical devices protected by the fuse array.

44 Claims, 4 Drawing Sheets

METHOD AND APPARATUS FOR COOLING ELECTRICAL FUSES

CROSS REFERENCE TO PRIOR APPLICATIONS

The present invention claims priority to U.S. Provisional Application Ser. No. 60/284,819, filed Apr. 19, 2001, the contents of which are incorporated herein by reference in their entirety.

BACKGROUND OF THE INVENTION

The present invention generally relates to cooling systems for electrical equipment. More particularly, the present invention relates to cooling electrical protective devices such as fuses that are attached to electrical terminals. Electrical power converter units are vital and expensive components used in a variety of electric power system applications such as metal rolling mills and transportation systems. Power converters must be cooled to maintain their proper operating temperature. In a typical air-cooled power converter unit, heat generated by the unit is removed by free or forced convection to the ambient air to maintain the unit's operating temperature within an acceptable range. Although some units are air-cooled, higher power units often generate too much heat to be sufficiently cooled by free or forced convection of heat to the ambient air. Consequently, such high power units may be liquid-cooled. Power converter units typically utilize auxiliary devices. In air-cooled units, such devices are usually sufficiently cooled by free convention (also referred to as passive cooling) or forced convection (also referred to as active cooling) of heat to the ambient air. However, auxiliary devices on liquid-cooled units, may not be sufficiently cooled by the air. One type of auxiliary device that may require additional cooling when attached to a liquid-cooled unit, or even a high-powered air cooled unit, is the electrical fuses or fuse arrays. The purpose of fuses is to isolate the power converter circuits or other electrical components and equipment during an electrical fault event by melting their elements, severing the electrical circuit, and stopping the flow of electric current. This isolation limits the damage from high electrical currents during a fault. Since the fuses produce waste heat in normal operation, they must be cooled to maintain temperature limits for proper power converter protection and fuse life. When a higher-powered unit is designed, additional fuses may be added to an existing fuse array to help increase the power rating, but the fuses may no longer be electrically coordinated with the power converter. The fuses" elements must be coordinated, with respect to thermal capacity and arc voltage, with the power converter components they are protecting. Thermal capacity electrical coordination is the coordination of thermal capacity of the fuses with the power converter electrical conductors (which may be calculated by electrical current squared and multiplied by time, or $I^2t$). Electrical arc voltage coordination is the coordination of the voltage level created when the fuse elements melt with the voltage level that can be withstood by the electrical components, equipment and insulation system. Simply adding more fuses to a fuse limited unit may not provide the required electrical coordination, and may increase the cost of the fuse array. Thus it is desirable, from both a performance standpoint and an economic standpoint, to use an existing fuse array or a slightly modified fuse array on liquid-cooled units and on air-cooled units that are fuse limited and may be converted to higher powered units. A solution that may allow the use of existing fuse arrays on a higher-powered unit is to use actively cooled fuses. Some fuses can operate at higher power levels when they are actively cooled. A power converter being designed as a high powered unit or an air cooled unit that is being refitted as a higher-powered unit may require few or no additional fuses to handle the increased power load if the fuses are actively cooled. One method of actively cooling the fuses is to force air over them. Although forced-air cooling may provide a cooling benefit, such systems may cause additional problems. For example, the increased volume of air flowing to the fuses carries with it an increased amount of particulate matter and other contaminants, which may condense on and around the fuses and other power converter devices and cause malfunctions. In addition, cooling the fuses with forced air may provide inconsistent cooling of the individual fuses in the array. For example, there is usually a narrow gap between the ends of the fuses and the electrical connection terminal and a narrow gap between fuse bodies. Such narrow gaps may restrict the airflow, causing insufficient cooling. Local heat build-up at the fuse ends could substantially degrade the performance and life of the fuses. In order for the electrically parallel fuses in an array to evenly share an electrical current, the individual fuses must be maintained at the same temperature. Due to these and other problems, it would be desirable to provide an improved apparatus for cooling fuse arrays that can be added to existing power converters or incorporated into new power converter designs to allow existing or slightly modified fuse arrays to operate at an increased power rating. It also would be desirable to provide such an apparatus at a minimal cost. In addition, because power converter units are typically used in industrial and commercial applications, making down time for repairs or refitting expensive, it also would be desirable to provide an improved apparatus that can be installed quickly and easily to minimize down time.

BRIEF SUMMARY OF THE INVENTION

The present invention overcomes the problems discussed above, and provides additional advantages, by employing a fluid cooling apparatus that cools electrical protective devices, such as fuse arrays having one or more fuses, mounted to electrical terminals.

Exemplary embodiments of the invention have one or more coolant passages attached to a pair of electrical terminals in a thermally conductive manner. Several coolant conduits are connected to the coolant passages and connected to a pressurized coolant source. The pressurized coolant source passes a cooling fluid through the conduits and passages, thereby directly cooling the terminals and indirectly cooling the fuse array. An exemplary embodiment may employ heat exchangers to cool the cooling fluid between successive passes to the electrical terminals. The cooling apparatus may also be used in conjunction with ambient air cooling of the fuses or other cooling systems.

In another exemplary embodiment of the apparatus of the present invention, the apparatus has a pair of coolant passages, each bent to have two roughly parallel portions. Each bent coolant passage is, for example, attached to one of the terminals by brazing the parallel portions to the terminal such that they divide each connection terminal into three approximately equally sized regions. The two terminals are interconnected by six fuses, which are attached to the terminals at each end of the fuses. Two fuses are located in each of the connection terminal regions noted above. Several coolant conduits are connected to the bent coolant passages and are connected to a pressurized coolant source, which passes cooling fluid through the conduits and the passages.

In an exemplary embodiment of the invention the electrical current rating of the fuses may be increased above their normal electrical current rating. In another exemplary embodiment, the service life of the fuses may be increased above their normal life. In yet another exemplary embodiment of the invention, the electrical current rating and service life of the fuses are increased while maintaining thermal capacity coordination (which may be calculated by $I^2t$) or electrical arc voltage coordination between the fuses and a power converter protected by the fuses.

In another exemplary embodiment of the invention, waste heat generated by the fuses is removed, thereby reducing the ambient air temperature and increasing air cooling to other devices being operated in conjunction with the fuses. In yet another exemplary embodiment, the waste heat removed from the fuses is employed to provide benefits to other parts of a system.

BRIEF DESCRIPTION OF THE DRAWINGS

The present invention can be understood more completely by reading the following detailed description of exemplary embodiments, in conjunction with the accompanying drawings, in which.

DETAILED DESCRIPTION

The embodiments of the present invention described herein are generally used in conjunction with a fuse array mounted between two electrical terminals. Although the embodiments are described herein in terms of fuse arrays, and more specifically in terms of fuse arrays associated with power converters, it should be understood that the present invention may be used with a variety of electrical protection devices that may benefit from a fluid cooling system.

In one embodiment a fuse array is mounted between a pair of electrical connection terminals. One or both of the terminals is directly cooled by means of a fluid coolant, and the cooled terminals maintain the temperature of the fuses within the required operating range. Heat is transferred from the terminals to the coolant by passing the coolant through coolant passages which are attached to the terminals in a thermally-conductive manner and which may be any suitable structure and material capable of communicating the fluid from the source and through the cooling circuit. A pressurized coolant source forces the coolant through the passages. The pressurized coolant source may be connected directly to the passages, or may transport the coolant to the passages through additional coolant conduits located between the pressurized coolant source and the passages. The coolant may also pass through one or more heat exchanging devices to assist with cooling. In addition, because the terminals typically are at a large electric voltage potential with respect to each other, other devices, and the electrical ground, the coolant conduit and passages may be electrically insulated by constructing them from a non-conductive material and using a non-conducting coolant, such as deionized water.

A suitable thermal operating range of the embodiments described herein is the temperature range that provides acceptable fuse operation. In one embodiment, the fuses provide acceptable operation when their temperature is between about zero degrees Celsius and about one hundred degrees Celsius.

Figure 1:
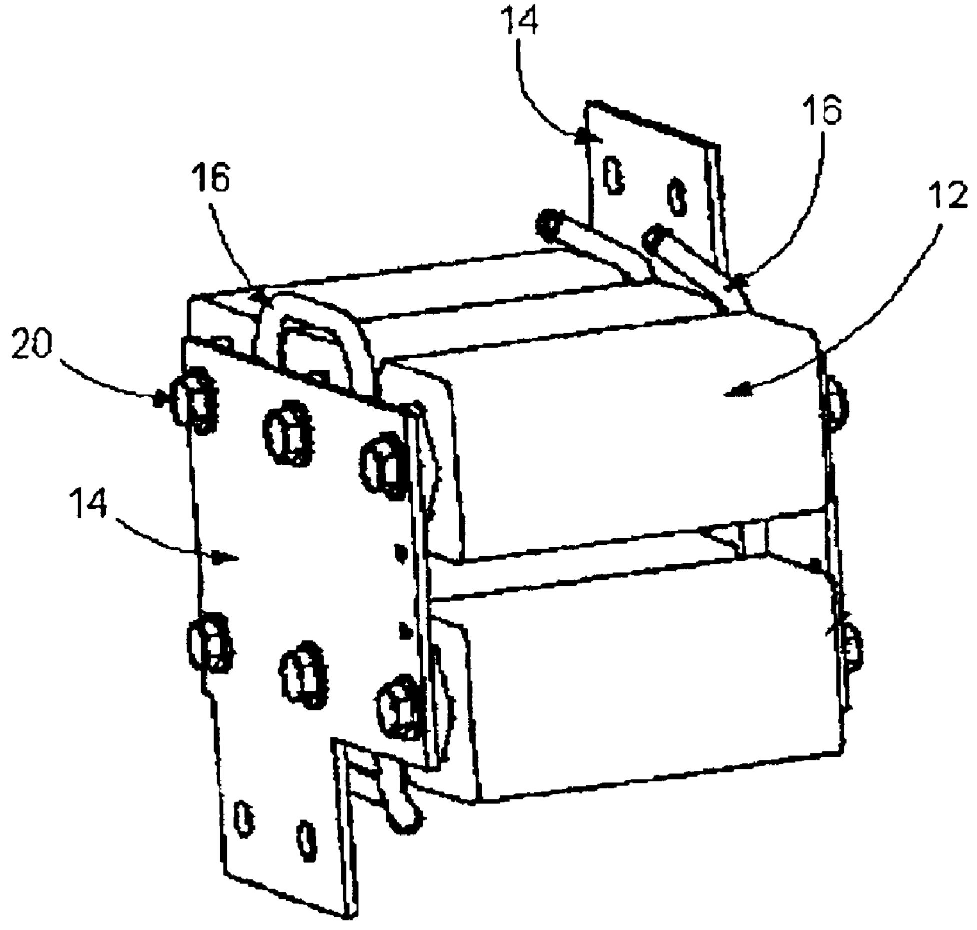
FIG. 1 is an isometric drawing of a portion of an embodiment of the present invention.

FIG. 1 illustrates one embodiment of a fluid cooling apparatus used in conjunction with the present invention. In the embodiment of FIG. 1, a fuse array comprising six electrical fuses 12 is mounted between a pair of electrical terminals 14 that are depicted in this embodiment as plate-like terminals. A coolant passage 16, shown in FIG. 1 as a tube, is attached to each electrical terminal 14.

The fuses 12 of the fuse array may be attached to the terminals 14 at both ends of each fuse 12. Electric current flows from one terminal 14, through the fuses 12, and into the opposing terminal 14. The fuses 12 are selected such that the fuse elements will melt, or blow, before the power converter or other associated devices are exposed to a damaging level of electrical energy. Electrical fuses are generally well known in the art, and the fuses 12 may be of any of a number of electrical fuse types, such as cylindrical fuses, blade-type cylindrical fuses, ferrule mounted fuses, clip-lock mounted fuses, screw-in fuses, and the like. The fuses 12 may use any number of circuit-breaking elements, such as parallel-connected pure silver elements, folded silver elements, ceramic-encased elements, and the like.

The fuse array may comprise a single fuse 12, or there may be more than one fuse 12 in the array. In one embodiment, there are six fuses 12 in the array. The fuses 12 may be arranged in a number of patterns. The patterns may be selected to facilitate cooling of the fuses 12, as is described in more detail herein. In one embodiment, the fuses 12 are arranged in two rows. In order to promote equal distribution of the electrical current among the fuses (and, consequently, for the fuses to provide optimum protection), it is preferred that the fuses be configured to provide the fuses with substantially identical thermal, electrical, and electromagnetic environments. In order to obtain this goal, the fuses may be separated from one another and located annularly or in other configurations around the path of the current flowing through the device being protected. In this manner, the currents flowing through the devices may be substantially uniform during normal operation and during transient events, such as a fuse blowing. In practice, however, practical advantages may be obtained by grouping all or some of the fuses into arrays. Although such grouping of the fuses may cause some degradation in overall performance, the degradation may be minimal, and the counter-balancing advantages of cost savings, improved serviceability, and other advantages may be substantial.

In one exemplary embodiment, the fuse array comprises six fuses, such as Ferraz-Shawmut semiconductor fuses, part number W221509 (available from Ferraz-Shawmut Incorporated, a corporation with North American headquarters in Newburyport, Mass.), arranged in a 3-by-2 pattern having two rows and three columns. In this exemplary embodiment, the centers of the fuses 12 are spaced approximately three and three quarters inches away from the adjacent fuses in the same row or column. In this embodiment, such an array provides proper over-current protection as long as the fuse 12 bodies are maintained within an acceptable temperature range, for example, between approximately zero degrees Celsius and approximately one hundred degrees Celsius. Other arrangements of rows and columns will be obvious to one skilled in the art based on the teachings herein. For example, the rows and columns may have a greater or lesser number of fuses, or may be staggered such that the columns or rows are oriented in any of a variety of configurations or other wise arranged.

The electrical terminals 14 may be made of any suitable electrically conductive material, such as copper, aluminum, and the like. The terminals 14 must be able to transfer electrical current to and from the fuses 12 without overheating the fuses or the terminal-to-fuse connections due to the electric load. In one embodiment, the terminals 14 comprise three-sixteenth"s inch thick copper plates. The fuses 12 may be attached to the terminals 14 by any suitable means known in the art. In the embodiment depicted in FIG. 1, the fuses 12 are attached to the terminals 14 by mounting bolts 20, that pass through the terminals 14 and are threaded into each end of each fuse 12. Any other suitable means of attachment known in the art may also be used, such as hooks, spring clips, and tapered holes. The type of attachment may vary for different types of fuses. In all cases, however, the connections preferably allow electricity to flow between the fuses 12 and the terminals 14 such that the joint between the fuses 12 and the terminals 14 does not overheat and prevents any open gaps susceptible to arcing.

In one embodiment, the arrangement of the coolant passage 16 or passages is designed to provide each of the fuses 12 with a substantially equal amount of cooling. Such a design prevents isolated fuses 12 from overheating, and helps to equalize any fuse temperature dependent variations in the fuse properties across the entire fuse array. Providing consistent fuse temperatures promotes even flow or sharing of electrical current among fuses 12 mounted in an electrically parallel fashion. One or both terminals 14 may be equipped with one or more cooling passages 16. In one embodiment, both terminals 14 are provided with substantially identical passage arrangements to provide equal cooling to the fuses 12 at both ends of the fuses 12. In some applications, however, additional cooling may be supplied to only one terminal 14, or part of one terminal, to account for differential heating or other asymmetrical heating patterns caused by the surroundings.

The coolant passage 16 or passages may be straight lengths of tubing material or they may be bent or formed. A single piece of tubing material may be manipulated into a shape that provides all of the necessary cooling for a terminal 14, to provide easier access to the ends of the passages 16, or for other reasons. The design of the coolant passages 16 will vary depending on the cooling requirements of the particular application and manufacturing and fabricating considerations.

Figure 2A:
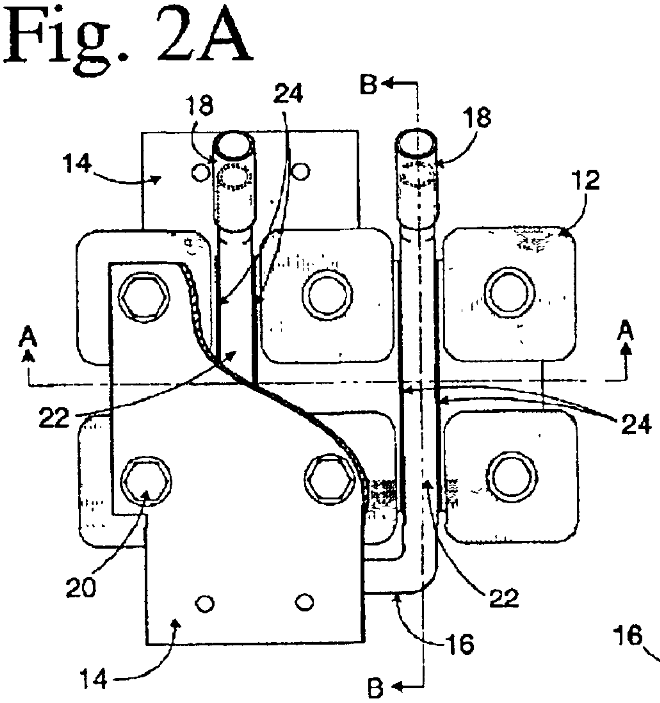
FIG. 2A is a view of a portion of an embodiment of the present invention shown with one electrical connection terminal partially cut away and one coolant passage, two coolant conduits, and the pressurized coolant source removed for improved clarity.
Figure 2C:
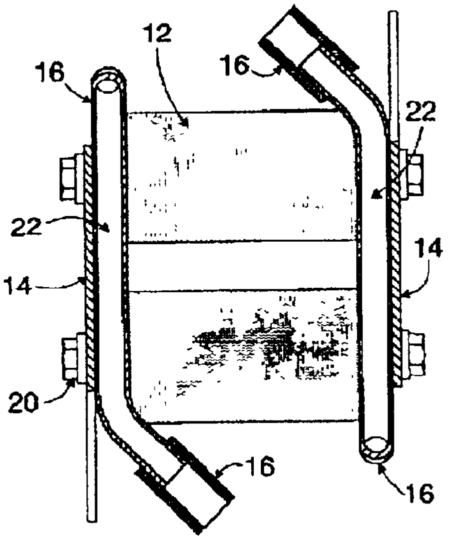
FIG. 2C is a cross sectional view of the portion of the embodiment of the present invention of FIG. 2A as viewed along line BB.
Figure 2B:
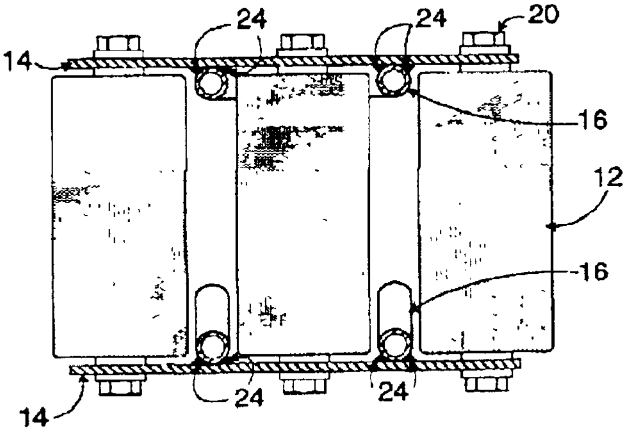
FIG. 2B is a cross sectional view of the portion of the embodiment of the present invention of FIG. 2A as viewed along line AA.

FIGS. 2A, 2B, and 2C, are three views of an embodiment of the present invention, with some parts removed or cut away for clarity. In the embodiment depicted in FIGS. 2A, 2B, and 2C, a single bent coolant passage 16 is attached to each terminal 14. Each of the passages 16 is bent into a U shape having two roughly parallel lengths 22, which are attached to the terminals 14 between different columns of fuses 12. This embodiment has been found to provide a substantially even distribution of cooling to each of the fuses 12.

The coolant passages 16 may be made from any material which is a suitable heat conductor and which can be operatively attached to the terminals 14, such as copper, aluminum, steel, and the like. The passages 16 may also have any of a number of cross sectional shapes, such as round, rectangular, and square shapes, and may further comprise cooling fins. In one embodiment of the present invention, the passages 16 are made from stainless steel tubing. Such tubing is a good heat conductor, easily formed, relatively inexpensive, and resists corrosion. In one embodiment, the passages 16 are made from stainless steel tubing having an inner diameter of three-tenths of an inch, and an outer diameter of three-eighths of an inch.

The coolant passages 16 may be connected to the terminals 14 by any means known in the art that allows a heat-conducting path between the passages 16 and the terminals 14. The attachment means may also be selected to increase heat transfer from the terminal 14 to the coolant passages 16. Such joining methods include, for example: retaining straps, soldering, brazing, welding, and adhesive bonding. It may be preferred to arrange the passages 16 to be in physical contact with the terminals 14 over the greatest possible surface area to improve heat transfer. It also may be preferred that the attachment means comprises a heat conducting material that increases the effective contact area between the passages 16 and the terminals 14, thereby improving heat transfer.

In one embodiment, the passages 16 are brazed to the terminals 14. Any brazing method may be used, such as torch brazing, dip brazing, induction brazing, and the like. Brazing may be particularly useful because the brazed joints 24 have suitable strength and high heat transferring properties, and are relatively inexpensive to manufacture. The brazed joints 24 may partially envelop the passages 16, thereby increasing the overall contact area between the passages 16 and the terminals 14, and improving the heat transfer from the terminals 14 to the passages 16.

Coolant is carried to the coolant passages 16 through one or more coolant conduits 18, which may be integral with or extensions of the coolant passages 16. The conduits 18 may comprise any suitable material. To accommodate manufacturing necessities and spatial constraints, the conduits 18 may be constructed of a material and/or be adapted to be easily formed and flexed. Further design considerations may require that the passages 16 and/or conduits 18 may be adapted to withstand the operating temperatures and voltages of the electrical system. Furthermore, the conduits 18 preferably are electrical insulators to prevent unwanted grounding or short circuiting of the system. If the conduits 18 are separate from the passages 16, the conduits 18 may be adapted to be easily attached to and detached from the coolant passages 16 to facilitate installation and maintenance. A variety of well-known attachment means may be used to attach the conduits 18 to the passages 16, such as hose clamps, interference fits, and compression fittings. In one embodiment, the conduits 18 are made from silicone tubing having an outer diameter of five-eighths of an inch and an inner diameter of three-eighths of an inch. The conduits 18 of this embodiment may be attached by fitting them over the ferruled ends of the coolant passages by hand then securing them with clamps.

Figure 3:
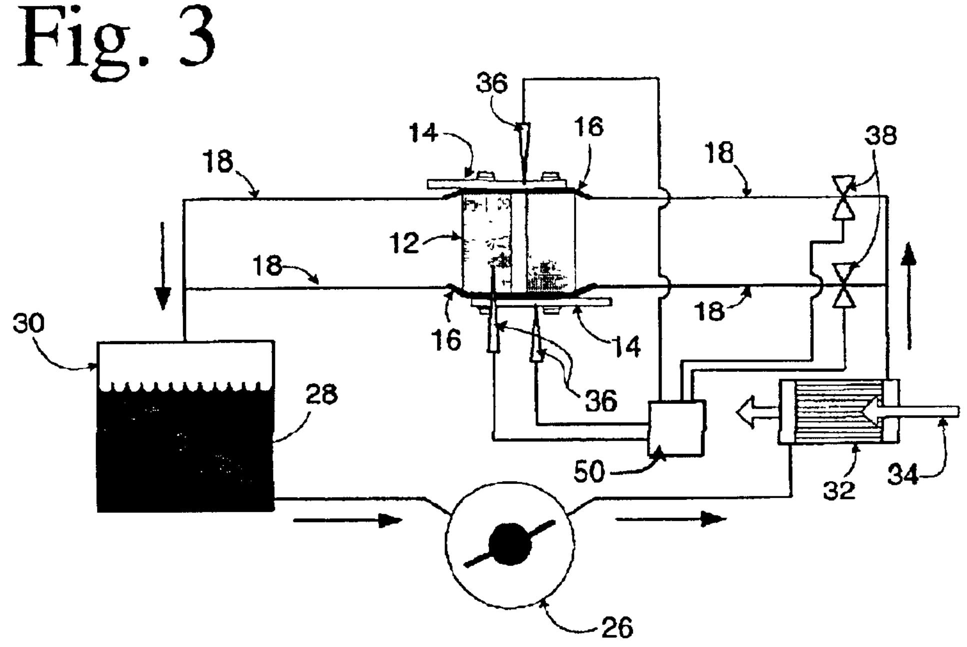
FIG. 3 is a schematic diagram of the cooling circuit of one embodiment of the present invention.

Referring now to FIG. 3, the apparatus further comprises one or more pressurized coolant sources that forces coolant through the heat exchange apparatus. The pressurized coolant source may be, for example, a pump 26, a raised reservoir (not shown), and the like.

The coolant 28 may be any fluid material, in a liquid or gaseous form, with a heat capacity that provides adequate cooling throughout the operating range of the apparatus. For example, water may be used for an apparatus having an operating range of about zero degrees Celsius to about 100 degrees Celsius. The thermal stability of the coolant 28 may be extended outside its normal range by the addition of antifreeze or other chemicals which stabilize or extend the liquid phase of the coolant 28. The coolant 28 can be a suitable electrical insulator, which will prevent unwanted grounding or short circuits of the electrical system. In one embodiment, the coolant 28 is deionized water, which provides good electrical insulation and relatively high heat carrying abilities.

Alternatively, the coolant 28 may comprise an electrically conductive material, such as tap water. However, if the coolant 28 is an electrical conductor, then additional features may be desired or required to electrically insulate the coolant 28 from the interior surfaces of the coolant passages 16 or to otherwise electrically insulate the apparatus to prevent unwanted grounding, shorting or excessive electrical current flow in the coolant 28. In one exemplary embodiment, this may be accomplished by coating the interior surfaces of the coolant passages 16 with an insulating layer of material, such as plastic, silicone, or certain ceramics, or by making the coolant passages 16 from an electrically insulating material. In another embodiment, the apparatus may be electrically insulated by using an electrically insulating coolant conduit 18 with an outside diameter of such a size that it fits within the coolant passage 16. Such a conduit 18 may be routed through the passage 16 such that heat is transferred from the terminals 14 to the coolant without being in physical contact with the coolant. In yet another embodiment, if the electrical system voltages are relatively low, tap water may be used without additional insulating steps. In designing a system using a conducting fluid such as ordinary tap water, care must be taken to ensure that the electrical current in the fluid does not cause substantial erosion of the materials comprising the system. Such a system may also create additional current to the ground, which may set off ground fault detectors, or cause other problems, which may necessitate further modifications of the system.

The coolant 28 is circulated through the coolant conduits 18 and coolant passages 16 at a flow rate that is sufficient to maintain the fuses 12 within their operating temperature limits for the desired power load. The calculation of such flow rates is known in the art, and such determinations may be made by routine experimentation. In one embodiment, deionized water is circulated at approximately one and one-half gallons per minute.

The pressurized coolant source, illustrated as a pump 26, may be any pump or suitable pressurized liquid source, such as a municipal water source, with a flow capacity sufficient to cool the fuses 12. The pump 26 may also be the same pressurized coolant source that is used to cool other electrical devices, such as a power converter to which the fuse array may be attached, or other fuse arrays.

A variety of coolant circuit designs may be used to accomplish the desired goal of cooling the fuses 12 in the fuse array. An example of a simple recirculating two-circuit design is depicted in FIG. 3. A pump 26 circulates coolant 28 through a heat exchanger 32, where the coolant 28 releases heat acquired from the terminals 14 into, for example, a flow of air 34. Heat exchangers are known in the art. From the heat exchanger 32, the coolant 28 circulates through a first pair coolant conduits 18. Each of these coolant conduits 18 provides coolant 28 to a coolant passage 16 attached to one terminal 14. From there, the coolant 28 flows through a second pair of coolant conduits 18, to a coolant reservoir 30. The coolant 28 is eventually recirculated to the pump 26 and sent back to the terminals 14 to absorb more heat.

The coolant circuit may comprise additional features to facilitate monitoring and control of the temperature of the fuses 12. For example, one or more sensors 36 may be located on the terminals 14 or the fuses 12. A control system such as a computer processor 50 may use the output of the sensors 36 to determine when to operate the pump 26 or when to open valves 38 or other control devices that allow coolant to pass to the terminals 14. In an embodiment having multiple pumps 26 or valves 38, the coolant may be directed to one or both terminals 14 as needed.

Figure 4:
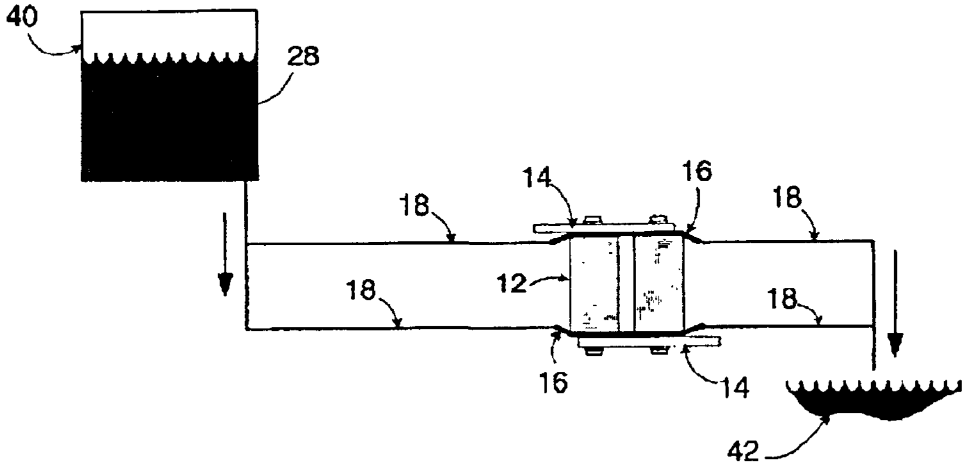
FIG. 4 is a schematic diagram of the cooling circuit of another embodiment of the present invention.

Other coolant circuit designs may be developed to accommodate the particular requirements of each electrical system. For example, a non-recirculating, or passive design, depicted in FIG. 4, may be used. In the embodiment of FIG. 4, the coolant 28 is supplied from a locally distributed tap water source 40, which is passed through the cooling circuit by the normal tap water pressure then released into a drain 42.

Various other open or closed circuit designs and features, other than those depicted in FIGS. 3 and 4 may be used with the present invention. For example, a single-circuit design may be used, in which the coolant 28 is passed through one coolant passage 16 attached to one terminal 14, then through another coolant passage 16 attached to the other terminal 14 before being released or recirculated. The cooling system may also be part of a larger cooling system that provides coolant to other devices, electrical or otherwise. In addition, a system may be designed having the heat exchanger 32, coolant reservoir 30, and pump 26 integrated into one or more integral units. In systems producing less heat, the heat exchanger 32, reservoir 30, or both may be omitted. The design of such systems is known in the art, and skilled artisans will be able to employ a suitable system without undue experimentation.

The present invention may be used in conjunction with a supplemental air cooling unit. Such a unit may be desired to provide additional cooling to the centers of the fuses when relatively long fuses 12 are involved. For example it has been found that it may be desirable to provide air cooling to fuses having a length of approximately seven or more inches. In such cases, the supplemental air cooling may reduce the temperature difference between the center of the fuse and the ends of the fuse, thereby improving the service life of the fuse.

The present invention provides an effective apparatus and method for maintaining the electrical coordination between fuses 12 and the electrical devices that they protect, and is particularly useful for adapting the fuses when the power rating of the system protected by the fuses is being increased. In one embodiment of the invention, the apparatus may be used to increase the electrical current rating of the fuses 12 above their normal electrical current rating. In another embodiment, the apparatus may be used to increase the service life of the fuses 12 above their normal service life. Furthermore, in yet another embodiment, the apparatus may be used to increase the electrical current rating and service life of the fuses 12 while simultaneously maintaining fuse thermal capacity electrical coordination, electrical arc voltage coordination, or both, with an electrical device, such as a power converter, that is protected by the fuses 12.

Figure 5:
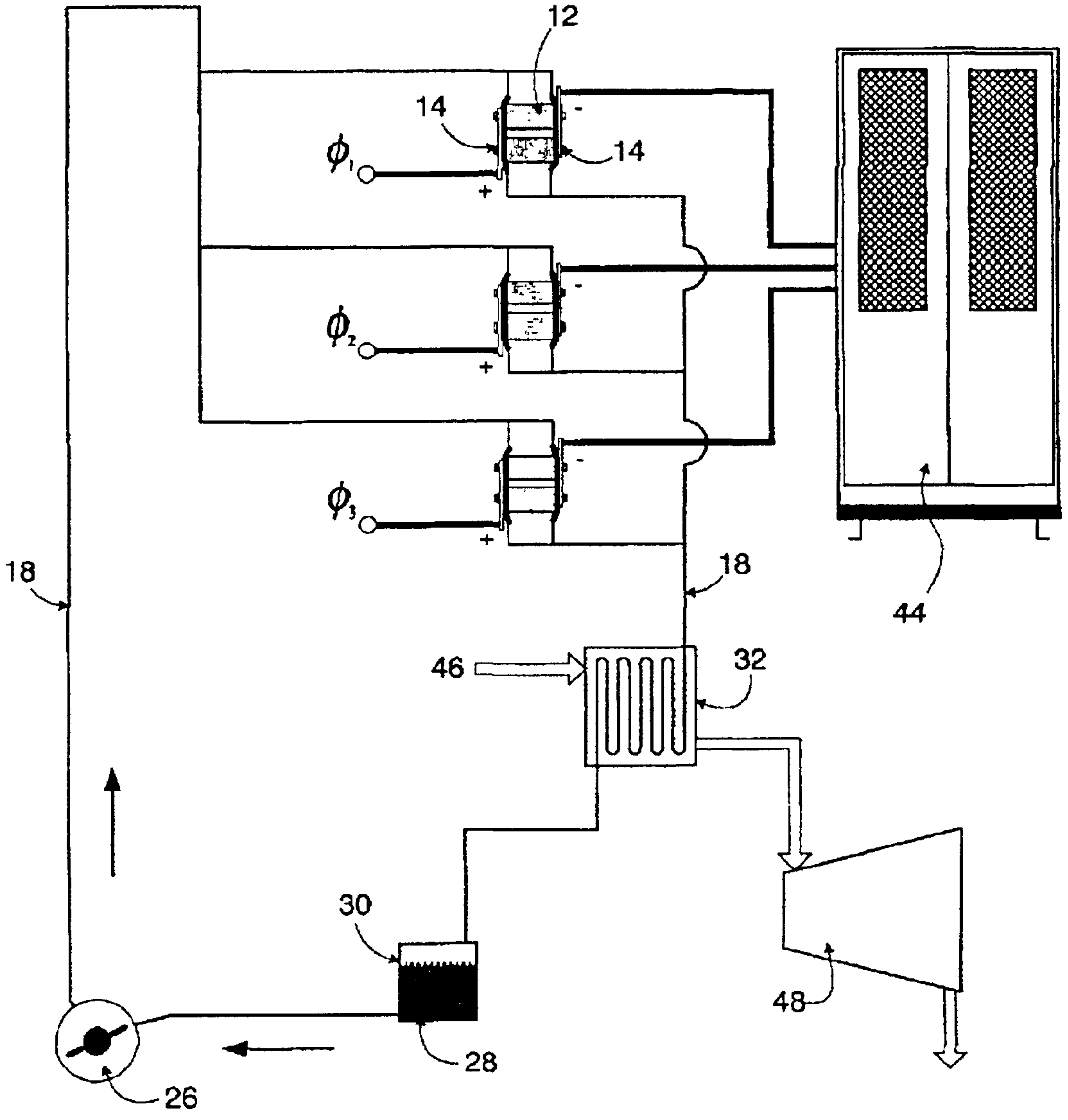
FIG. 5 is a schematic diagram of an embodiment of the present invention being used to cool an electrical device, and further providing a waste heat recovery function.

FIG. 5 is a schematic diagram of an embodiment of the present invention being used to cool fuses that protect a power converter 44. In the depicted embodiment, a pump 26 circulates coolant 28 from reservoir 30 through passage 18 to three fuse arrays. In the exemplary embodiment, each fuse array is attached in electrical series with a power line corresponding to a phase $\phi_1$, $\phi_2$, $\phi_3$ of a three-phase power converter 44 to protect the power converter 44.

In addition to providing the aforementioned electrical benefits, the present invention also may provide ocher benefits with regard to waste heat evacuation and reuse. For example, it has been found that fuses 12 being cooled by the present invention deposit less waste heat into the air surrounding the fuses than conventional air-cooled fuses. As a consequence, nearby devices no longer have to compete with the fuses 12 for cooling air, and the ambient air cools the nearby devices more efficiently than in a system not employing the present invention. For example, FIG. 5 shows fuses 12 nearby power converter 44. Improving the cooling of the nearby devices may increase their service life and operating performance, and may provide other benefits. These benefits may be particularly valuable when the fuses 12 and other electrical devices are encased in a cabinet or other housing having relatively restricted airflow.

Another benefit that may be provided by the present invention is that the waste heat removed from the fuses 12 by the coolant 28 may be used as a source of high quality heat for other parts of the system or some other system. High quality heat sources, such as heated water, are often used in industrial systems to heat devices or materials. For example, the heated coolant 28 may be passed through a heat exchanger 32 to preheat gases 46 entering a gas turbine combustion chamber 48 in order to increase the turbine"s operating efficiency. The beneficial reuse of waste heat generated by the fuses 12 is facilitated by removing the waste heat in a dense fluid medium, such as water, and may be difficult to obtain using an air-cooled fuse. It will be obvious to one skilled in the art that the waste heat may be used for other beneficial uses as well.

Although the present invention has been described herein as a device for cooling electrical protection devices such as fuses, it should be readily apparent to one skilled in the art that the present invention may also be used to cool other electrical devices. For example, the present invention may be used to cool capacitors, relays, power semiconductor devices such as silicon controlled rectifiers, and other electrical devices that create or are exposed to heat during their operation. In addition, it should be clear to one skilled in the art that the present invention may be easily modified to heat electrical devices.

While the foregoing description includes many details and specificities, it is to be understood that these have been included for purposes of explanation only, and are not to be interpreted as limitations of the present invention. Many modifications to the embodiments described above can be made without departing from the spirit and scope of the invention, as is intended to be encompassed by the following claims and their legal equivalents.

What is claimed is:

1. An apparatus for cooling one or more electrical protective devices mounted to at least one electrical terminal, the apparatus comprising:

one or more coolant passages being thermally-conductive with at least one electrical terminal, the at least one electrical terminal being in the shape of a plate; and one or more coolant sources, connected to the one or more coolant passages, for passing coolant fluid through the one or more coolant passages, whereby the at least one electrical terminal is cooled; and at least one of the coolant passages being disposed along and in parallel to the at least one electrical terminal such that a length, of a portion, of the at least one of the coolant passages lies along the electrical terminal that is in the shape of a plate wherein the one or more coolant passages are tubes made from at least one of the group of materials consisting of stainless steel, steel, copper, and aluminum.

2. An apparatus for cooling one or more electrical protective devices mounted to at least one electrical terminal, the apparatus comprising:

one or more coolant passages being thermally-conductive with at least one electrical terminal, the at least one electrical terminal being in the shape of a plate; and one or more coolant sources, connected to the one or more coolant passages, for passing coolant fluid through the one or more coolant passages, whereby the at least one electrical terminal is cooled; and at least one of the coolant passages being disposed along and in a parallel to the at least one electrical terminal such that a length, of a portion, of the at least one of the coolant passages lies along the electrical terminal that is in the shape of a plate;

wherein at least one of the one or more electrical protective devices is a fuse array comprising two or more fuses.

3. The apparatus of claim 2, wherein each fuse has opposed longitudinal ends, each end being mounted to an electrical terminal.

4. The apparatus of claim 2, wherein the fuse array is comprised of two or more fuses arranged in rows and columns.

5. The apparatus of claim 4, wherein the one or more coolant passages are attached to each of the electrical terminals between each of the columns, the coolant passages being connected to the electrical terminal along a portion of a length of the coolant passages.

6. The apparatus of claim 2, wherein the fuse array has a fuse operating temperature range of approximately 0 degrees Celsius to approximately 100 degrees Celsius.

7. The apparatus of claim 1, wherein the electrical protective device protects a power converter.

8. The apparatus of claim 1, wherein the electrical terminal is made from at least one of the group of materials consisting of copper, iron, steel, and aluminum.

9. The apparatus of claim 5, wherein the coolant passages are brazed to the terminals providing brazed joints connecting the terminal to the coolant passages, the brazed joints partially enveloping the coolant passages along a length of the coolant passages.

10. The apparatus of claim 1, wherein the coolant fluid is an electrically non-conductive material.

11. The apparatus of claim 10, wherein the coolant fluid is deionized water.

12. The apparatus of claim 1, wherein the one or more coolant sources are connected to the one or mate coolant passages by one or more conduits.

13. The apparatus of claim 12, wherein the one or more conduits are made from an electrically non-conductive material.

14. The apparatus of claim 13, wherein the one or more conduits are made from silicone.

15. The apparatus of claim 1, further comprising one or more heat exchangers, interposed with the one or more coolant passages and the one or more coolant sources, for cooling the coolant fluid.

16. The apparatus of claim 15, wherein the heat exchanger evacuates waste heat from the coolant fluid to one or mare additional fluids.

17. The apparatus of claim 16, wherein the waste heat evacuated into the one or more additional fluids is used as a source of high quality heat.

18. An apparatus for cooling a fuse array mounted between two electrical terminals comprising:

at least one coolant passage being attached to each of the electrical terminals such that the coolant passage divides each of the electrical terminals into approximately equally sized regions; and groupings of fuses attached to and disposed respectively intermediate the two electrical terminals in each of the approximately equally sized regions, thereby interconnecting the electrical terminals; and at least one of the coolant passages being disposed along and in parallel to the at least one electrical terminal suck that a length, of a portion, of the at least one of the coolant passages lies along the electrical terminal, which is in the shape of a plate.

19. The apparatus of claim 18, further comprising a plurality of coolant conduits, connected to the coolant passage, at least one of the coolant conduits being connected to at least one coolant source for passing the coolant fluid through the coolant conduits and the coolant passages.

20. The apparatus of claim 18, wherein the fuse array comprises groupings of fuses configured in columns.

21. A method far cooling one or more electrical protective devices mounted between electrical terminals comprising:

attaching one or more coolant passages in a thermally-conductive manner to at least one electrical terminal along a length of the coolant passages; and connecting one or more coolant sources to the one or more coolant passages, for passing coolant fluid through the one or wore coolant passages;

at least one of the coolant passages being disposed along and in parallel to the at least one electrical terminal such that a length, of a portion, of the at least one of the coolant passages is connected to the electrical terminal, which is in the shape of a plate; and further comprising making the one or more coolant passages from tubes made from at least one of the group of material consisting of stainless steel, steel, cooper, and aluminum.

22. A method for cooling one or more electrical protective devices mounted between electrical terminals comprising:

attaching one or more coolant passages in a thermally-conductive manner to at least one electrical terminal along a length of the coolant passages; and connecting one or more coolant sources to the one or more coolant passages for passing coolant fluid through the one or more coolant passages;

at least one of the coolant passages being disposed along an din parallel to the at least one electrical terminal such that a length, of a portion, of the at least one of the coolant passages is connected to the electrical terminal, which is in the shape of a plate; wherein at least one of the one or more electrical protective devices is a fuse array comprising two or more fuses.

23. The method of claim 22, wherein each fuse has opposed longitudinal ends, each end being mounted to an electrical terminal.

24. The method of claim 22, wherein the fuse array is comprised of two or more fuses arranged in rows and columns.

25. The method of claim 24, wherein the step of attaching one or more coolant passages comprises attaching one or more coolant passages to each of the electrical terminals between each of the columns.

26. The method of claim 22, wherein the fuse array has a fuse operating temperature of between approximately 0 degrees Celsius and approximately 100 degrees Celsius.

27. The method of claim 22, wherein the electrical device protected by the one or more fuses is a power converter.

28. The method of claim 22, further comprising mating the at least one electrical terminal from at least one of the group of materials consisting of copper, iron, steel, and aluminum.

29. The method of claim 21, further comprising brazing the one or more coolant passages to the at least one electrical terminal.

30. The method of claim 21, wherein the coolant fluid comprises an electrically non-conductive material.

31. The method of claim 30, wherein the coolant fluid comprises providing deionized water.

32. The method of claim 21, wherein tire step of connecting one or more coolant sources to the one or more coolant passages comprises connecting one or more coolant sources to the one or more coolant passages by one or more conduits.

33. The method of claim 32, wherein the one or more conduits are made from an electrically non-conductive material.

34. The method of claim 24, wherein the one or more conduits are made from silicone.

35. The method of claim 21 further comprising locating one or more heat exchangers between the one or more coolant passages and the one or more coolant sources, for cooling she coolant fluid.

36. The method of claim 35, further comprising evacuating waste heat from the coolant fluid to one or more additional fluids.

37. The method of claim 36, further comprising using the waste heat evacuated into the one or more additional fluids as a source of high quality heat.

38. A method for cooling a fuse array mounted between two electrical terminals comprising:

attaching a pair of coolant passages, each shaped to have two or more roughly parallel lengths, to each at the electrical terminals along the roughly parallel lengths such that the roughly parallel lengths of each of the coolant passages divide each of the electrical terminals into approximately equally sized regions;

attaching a column of fuses so each electrical terminal in each of she approximately equally sized regions, thereby interconnecting the electrical terminals;

providing coolant fluid; and connecting a plurality of coolant conduits to the pair of coolant passages connecting as least one of the coolant conduits to as least one coolant source for passing the coolant fluid through the coolant conduits and the coolant passages.

39. A method for increasing the electrical current rating of a fuse above its normal electric current rating comprising:

attaching one or more fuses to at least one electrical terminal;

attaching one or more coolant passages in a thermally-conductive manner to the at least one electrical terminal; and connecting one or more coolant sources to she one or mare coolant passages, for passing coolant fluid through the one or more coolant passages; and wherein the attaching one or more coolant passages in a thermally-conductive manner to the at least one electrical terminal includes attaching a pair of coolant passages, each shaped to have two or more roughly parallel lengths, to an electrical terminal along the roughly parallel lengths such that the roughly parallel lengths of each of the coolant passages divide the electrical terminal into approximately equally sized regions.

40. A method for increasing the service life of a fuse above its normal service life comprising:

attaching one or more fuses to at least two electrical terminals;

attaching one or more coolant passages in a thermally-conductive manner to the at least one electrical terminal; and connecting one or more coolant sources to the one or more coolant passages, for passing coolant fluid through the one or more coolant passages; and wherein the attaching one or more coolant passages in a thermally-conductive manner to the at least one electrical terminal includes attaching a pair of coolant passages, each shaped to have two or more roughly parallel lengths, to an electrical terminal along the roughly parallel lengths such that the roughly parallel lengths of each of the coolant passages divide the electrical terminal into approximately equally sized regions, the electrical terminals each being plate-like; and wherein each electrical terminal is provided with substantially identical coolant passage arrangements.

41. The method of claim 40, wherein the electrical current raring of the fuse is increased above its normal electric current rating while maintaining fuse thermal capacity electrical coordination with an electrical device protected by the fuse.

42. The method of claim 41, wherein the thermal capacity electrical coordination is calculated by the current squared and multiplied by the time.

43. The method of claim 40, wherein the electrical current rating of the fuse is increased above its normal electric current raring while maintaining fuse electrical arc voltage coordination with an electrical device protected by the fuse.

44. An apparatus for cooling one or more electrical protective devices mounted to at least one electrical terminal, the apparatus comprising:

one or more coolant passages being thermally-conductive with at least one electrical terminal, the at least one electrical terminal being in the shape of a plate; and one or more coolant sources, connected to the one or more coolant passages, for passing coolant fluid through the one or more coolant passages, whereby the at least one electrical terminal is cooled; and at least one of the coolant passages being disposed along and in parallel to the at least one electrical terminal such that a length, of a portion, of the at least one of the coolant passages lies along the electrical terminal that is in the shape of a plate;

wherein the at least one of the coolant passages is shaped to have two or more roughly parallel lengths, laying against an electrical terminal along the roughly parallel lengths such that the toughly parallel lengths of each of the coolant passages divide each of the electrical terminals into approximately equally sized regions.

* * * * *

UNITED STATES PATENT AND TRADEMARK OFFICE

CERTIFICATE OF CORRECTION

PATENT NO. : 6,801,433 B2 
APPLICATION NO. : 09/683496
DATED : October 5, 2004
INVENTOR(S) : Brian Eric Lindholm et al.

It is certified that error appears in the above-identified patent and that said Letters Patent is hereby corrected as shown below:

Col. 9, line 14: replace “ocher” with --other--;
Claim 2, col. 10, line 27: delete “a” before “parallel”;
Claim 12, col. 10, line 63: replace “mate” with --more--;
Claim 16, col. 11, line 8 replace “mare” with --more--;
Claim 18, col. 11, line 25: replace “suck” with --such--;
Claim 21, col. 11, line 35: replace “far” with --for--;
Claim 21, col. 11, line 43: replace “wore” with --more--;
Claim 21, col. 11, line 51: replace “material” with --materials--, and replace “cooper” with --copper--;
Claim 22, col. 11, lines 61-62: replace “an din” with --and in--;
Claim 28, col. 12, line 15, replace “22” with --21-- and replace “mating” with --making--;
Claim 32, col. 12, line 27: replace “tire” with --the--;
Claim 34, col. 12, line 34: replace “24” with --33--;
Claim 35, col. 12, line 39: replace “she” with --the--;
Claim 38, col. 12, line 49: replace “at” with --of--;
Claim 38, col. 12, line 54: replace “so” with --to--;
Claim 38, col. 12, line 55: replace “she” with --the--;
Claim 38, col. 12, line 61: replace both occurrences of “as” with --at--;

UNITED STATES PATENT AND TRADEMARK OFFICE

CERTIFICATE OF CORRECTION

PATENT NO. : 6,801,433 B2
APPLICATION NO. : 09/683496
DATED : October 5, 2004
INVENTOR(S) : Brian Eric Lindholm et al.

It is certified that error appears in the above-identified patent and that said Letters Patent is hereby corrected as shown below:

Claim 39, col. 13, line 4: replace “she” with --the--;
Claim 39, col. 13, line 5: replace “mare” with --more--;
Claim 41, col. 14, line 4: replace “raring” with --rating--;
Claim 43, col. 14, line 12: replace “raring” with --rating--;
Claim 44, col. 14, line 32: replace “toughly” with --roughly--.

Signed and Sealed this

Twelfth Day of February, 2008

JON W. DUDAS
*Director of the United States Patent and Trademark Office*